United States Patent
Dirksen et al.

(10) Patent No.: US 6,872,328 B2
(45) Date of Patent: Mar. 29, 2005

(54) METHOD OF POLISHING OR PLANARIZING A SUBSTRATE

(75) Inventors: James A. Dirksen, Oswego, IL (US); David W. Boldridge, Oswego, IL (US); Gautam S. Grover, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 274 days.

(21) Appl. No.: 09/737,905

(22) Filed: Dec. 15, 2000

(65) Prior Publication Data

US 2002/0076932 A1 Jun. 20, 2002

Related U.S. Application Data

(60) Provisional application No. 60/172,540, filed on Dec. 17, 1999.

(51) Int. Cl.⁷ ............................................. C09K 13/00
(52) U.S. Cl. ..................................... 252/79.1; 438/691
(58) Field of Search ................................ 438/690, 691, 438/692, 706, 745; 252/79.1

(56) References Cited

U.S. PATENT DOCUMENTS

| | | | | |
|---|---|---|---|---|
| 4,664,679 A | * | 5/1987 | Kohyama et al. | 51/308 |
| 5,114,881 A | * | 5/1992 | Kaneko et al. | 501/12 |
| 5,226,930 A | | 7/1993 | Sasaki | |
| 5,340,370 A | * | 8/1994 | Cadien et al. | 51/308 |
| 5,352,277 A | | 10/1994 | Sasaki | |
| 5,527,423 A | | 6/1996 | Neville et al. | 156/636.1 |
| 5,664,990 A | * | 9/1997 | Adams et al. | 451/60 |
| 5,759,917 A | * | 6/1998 | Grover et al. | 106/11 |
| 5,767,016 A | | 6/1998 | Muroyama | |
| 5,895,509 A | * | 4/1999 | Ohmi et al. | 51/307 |
| 5,993,686 A | * | 11/1999 | Streinz et al. | 252/79.3 |
| 6,126,853 A | * | 10/2000 | Kaufman et al. | 252/79.1 |
| 6,136,711 A | * | 10/2000 | Grumbine et al. | 216/88 |
| 6,294,105 B1 | * | 9/2001 | Feeney et al. | 252/79.1 |
| 6,309,560 B1 | * | 10/2001 | Kaufman et al. | 252/79.1 |
| 6,316,365 B1 | * | 11/2001 | Wang et al. | 438/618 |

FOREIGN PATENT DOCUMENTS

WO    WO 99/64527 A1    12/1999

* cited by examiner

*Primary Examiner*—Kin-Chan Chen
(74) *Attorney, Agent, or Firm*—Caryn Borg-Breen

(57) ABSTRACT

A method of polishing or planarizing a substrate comprising abrading at least a portion of the surface of a substrate comprising a metal, metal oxide, metal composite, or mixture thereof, with a composition comprising a metal oxide abrasive and a liquid carrier, wherein the composition has a pH of about 7 or less and the metal oxide abrasive has a total surface hydroxyl group density no greater than about 3 hydroxyl groups per $nm^2$.

10 Claims, No Drawings

METHOD OF POLISHING OR PLANARIZING A SUBSTRATE

CROSS-REFERENCE TO RELATED PATENT APPLICATIONS

This patent application claims priority to provisional U.S. Patent Application No. 60/172,540 filed on Dec. 17, 1999.

TECHNICAL FIELD OF THE INVENTION

The present invention relates to a method of polishing or planarizing a substrate, particularly a semiconductor substrate.

BACKGROUND OF THE INVENTION

Compositions for polishing or planarizing substrates comprising a metal, metal oxide, or metal composite are well known in the art. Such compositions typically contain an abrasive material in an aqueous solution and are known as polishing slurries. The polishing slurries usually are applied to a surface of the substrate by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising metal oxide particles in an aqueous medium.

Conventional polishing compositions sometimes are not entirely satisfactory at polishing or planarizing substrates comprising metals, metal oxides, or metal composites. In particular, the abrasive material of the polishing slurry can adhere to the substrate being polished or planarized, such that abrasive material remains on the surface of the substrate following polishing and subsequent cleaning. The use of such polishing slurries in chemical-mechanical polishing can result in poor surface quality due to the leftover slurry deposits. Since the performance of a substrate is directly associated with the planarity of its surface and absence of particulate deposits, it is important to use a polishing composition that leaves a high quality polish with minimal residual slurry particles on the surface of the substrate.

There remains a need for a method of polishing or planarizing a substrate that exhibits a desirable polishing or planarization efficiency, uniformity, and removal rate but minimizes or avoids residual abrasive material being left on the substrate following polishing or planarization. The present invention seeks to provide such a method. These and other advantages of the present invention will be apparent from the description of the invention provided herein.

BRIEF SUMMARY OF THE INVENTION

The present invention provides a method of polishing or planarizing a substrate comprising abrading at least a portion of the surface of a substrate comprising a metal, metal oxide, metal composite, or mixture thereof, with a composition comprising a metal oxide abrasive and a liquid carrier, wherein the composition has a pH of about 7 or less and the metal oxide abrasive has a total surface hydroxyl group density no greater than about 3 hydroxyl groups per $nm^2$.

DETAILED DESCRIPTION OF THE INVENTION

The present invention provides a method of polishing or planarizing a substrate. The method comprises contacting the substrate with a metal oxide abrasive composition and abrading at least a portion of the surface of the substrate by movement of the metal oxide abrasive relative to the substrate. Such contacting and abrading can take place by any suitable technique. For example, the metal oxide abrasive composition can be applied to the surface of the substrate and used to abrade at least a portion of the surface of the substrate through use of a polishing pad.

The substrate comprises a metal, metal oxide, metal composite, or mixture thereof. The substrate can comprise, consist essentially of, or consist of any suitable metal. Suitable metals include, for example, copper, aluminum, titanium, tungsten, gold, platinum, iridium, ruthenium, and combinations (e.g., alloys or mixtures) thereof. Preferably, the metal of the substrate is tungsten. The substrate also can comprise, consist essentially of, or consist of any suitable metal oxide. Suitable metal oxides include, for example, alumina, silica, titania, ceria, zirconia, germania, magnesia, and combinations thereof. Preferably, the metal oxide of the substrate is silica. In addition, the substrate can comprise, consist essentially of, or consist of any suitable metal composite. Suitable metal composites include, for example, metal nitrides (e.g., titanium nitride and tungsten nitride), metal carbides (e.g., silicon carbide and tungsten carbide), and nickel-phosphorus. Substrates that consist essentially of, or consist entirely of, silicon are not suitable substrates for the method of the present invention. The present invention is particularly well-suited for the planarizing or polishing of memory or rigid disks, metals (e.g., noble metals), ILD layers, integrated circuits, semiconductors, micro-electromechanical systems, ferroelectrics, magnetic heads, polymeric films, and low and high dielectric constant films.

The metal oxide abrasive can be any suitable metal oxide that can function as an abrasive. Suitable metal oxides include alumina, silica, titania, ceria, zirconia, germania, magnesia, and combinations thereof. Preferably, the metal oxide abrasive is silica. More preferably, the metal oxide abrasive is fumed silica.

The metal oxide abrasive is characterized by a total surface hydroxyl group density that is sufficiently low that adherence of the metal oxide abrasive to the substrate being polished therewith, particularly after subsequent cleaning, does not exceed a satisfactory level (e.g., adherence of the metal oxide abrasive to the substrate is substantially or entirely avoided). The desired total surface hydroxyl group density is less than the total surface hydroxyl group density saturation level for the particular metal oxide abrasive. At saturation, silica, for example, has a total surface hydroxyl group density of about 4.7–5 hydroxyl groups per $nm^2$.

The metal oxide abrasive typically is characterized by a total surface hydroxyl group density of no greater than about 4 hydroxyl groups per $nm^2$. Preferably, the metal oxide abrasive is characterized by a total surface hydroxyl group density of no greater than about 3 hydroxyl groups per $nm^2$. More preferably, the total surface hydroxyl group density is no greater than about 2.8 hydroxyl groups per $nm^2$, e.g., 2–2.8 hydroxyl groups per $nm^2$. Most preferably, the total surface hydroxyl group density is no greater than about 2.5 hydroxyl groups per $nm^2$. The total surface hydroxyl group density also can be no greater than about 2 hydroxyl groups per $nm^2$, e.g., 1–2 hydroxyl groups per $nm^2$, or even no greater than about 1 hydroxyl group per $nm^2$, e.g., 0.7–1 hydroxyl groups per $nm^2$. The total surface hydroxyl group density of the metal oxide abrasive can be quantitatively analyzed by any suitable method.

The metal oxide abrasive with the aforementioned total surface hydroxyl group density can be prepared by any suitable method. For example, such a metal oxide abrasive can be a direct result of the metal oxide preparation process and/or subjected to post-treatment to reduce the total surface hydroxyl group density. Suitable methods for the reduction of total surface hydroxyl group density include, for example: (i) reaction of total surface hydroxyl groups with a coupling agent, (ii) esterifying total surface hydroxyl groups with an alcohol, and (iii) subjecting total surface hydroxyl groups to dehydration condensation by exposure to high temperature (e.g., by heating the metal oxide). Methods for preparing the metal oxide abrasive with the desired total surface hydroxyl group density are described in U.S. Pat. No. 4,664,679.

Any suitable coupling agent can be used for the reduction of the surface hydroxyl density of metal oxide abrasives. Suitable coupling agents include, for example, silane coupling agents (i.e., methyltrimethoxysilane or hexamethyldisilazane), aluminum coupling agents (i.e., acetoalkoxy aluminum diisopropylate), an organotitanium coupling agent (i.e., isopropyl-triisostearoyl titanate), and an organophosphorous coupling agent (i.e., dibutyl 2-methallyloxyethyl phosphate). Any suitable method for treatment with the coupling agent can be utilized, e.g., liquid phase treatment or gas phase treatment. Moreover, the coupling agent treatment can be evaluated by any suitable method, such as, for example, organic elemental analysis of carbon content in the metal oxide abrasive.

Any suitable alcohol can be used for the reduction of the total surface hydroxyl group density of metal oxide abrasives. Suitable alcohols include, for example, straight-chain or branched-chain saturated monohydric alcohols having 1–18 carbon atoms, e.g., methanol, ethanol, n-propanol, iso-propanol, n-butanol or t-butanol. Preferably, the esterification treatment is conducted in a gas phase with a temperature between the boiling point of the alcohol used and 350° C.

Any suitable temperature can be used for the dehydration condensation of hydroxyl groups of the metal oxide abrasive. The metal oxide abrasive preferably is heated at a temperature of at least about 500° C. (e.g., about 550–600° C.). The metal oxide abrasive can be heated at higher temperatures, such as at a temperature of at least 800° C. or even at least 1000° C.

The composition used in the present inventive method comprises a liquid carrier, in addition to the metal oxide abrasive. Any suitable liquid carrier can be used in the metal oxide abrasive composition. A carrier is used to facilitate the application of the metal oxide abrasive onto the surface of a suitable substrate to be polished or planarized. A preferred liquid carrier is water.

The metal oxide abrasive composition has a pH of about 7 or less. Such a pH inhibits hydrolyzation of the metal oxide abrasive. At a pH greater than about 7, the metal oxide abrasive is rehydrolyzed in a reasonable amount of time, such that the total surface hydroxyl group density eventually reaches the saturation point (i.e., about 4.7–5 hydroxyl groups per $nm^2$). Thus, if the metal oxide abrasive composition with a total surface hydroxyl group density less than saturation encounters a higher pH at some point in time, the total surface hydroxyl group density of the metal oxide abrasive could undesirably increase, so it is desirable to retain a pH of about 7 or less throughout the process of preparing the metal oxide abrasive composition.

The metal oxide abrasive composition preferably has a pH of about 6 or less, e.g., about 5–6. More preferably, the composition has a pH of about 5 or less, e.g., about 4–5. Such a relatively lower pH will not function to reduce the total surface hydroxyl group density of the metal oxide abrasive, but rather provides for maintenance of a reduced total surface hydroxyl group density with respect to the metal oxide abrasive for a significant period of time, e.g., during storage of the metal oxide abrasive composition before use in a polishing or planarizing process. The metal oxide abrasive also can be chemically treated to inhibit hydrolyzation during storage of the metal oxide abrasive composition.

The pH of the metal oxide abrasive composition can be adjusted, if necessary, in any suitable manner, e.g., by adding a pH adjuster to the composition. Suitable pH adjusters include, for example, bases such as potassium hydroxide, ammonium hydroxide, sodium carbonate, and mixtures thereof, as well as acids such as mineral acids (e.g., nitric acid and sulfuric acid) and organic acids (e.g., acetic acid, citric acid, malonic acid, succinic acid, tartaric acid, and oxalic acid).

The metal oxide abrasive composition optionally can further comprise one or more other additives. Such additives include surfactants (e.g., cationic surfactants, anionic surfactants, nonionic surfactants, amphoteric surfactants, fluorinated surfactants, and mixtures thereof), polymeric stabilizers or other surface active dispersing agents (e.g., phosphoric acid, organic acids, tin oxides, and phosphonate compounds), pH buffers (e.g., potassium phosphate), and polishing accelerators such as catalysts, oxidizers, and chelating or complexing agents (e.g., metal, particularly ferric, nitrates, sulfates, halides (including fluorides, chlorides, bromides, and iodides), compounds with carboxylate, hydroxyl, sulfonic, and/or phosphonic groups, di-, tri-, multi-, and poly-carboxylic acids and salts (such as tartaric acids and tartrates, malic acid and malates, malonic acid and malonates, gluconic acid and gluconates, citric acid and citrates, phthalic acid and phthalates, pyrocatecol, pyrogallol, gallic acid and gallates, tannic acid and tannates), amine-containing compounds (such as primary, secondary, tertiary, and quaternary amines and amino acids), peroxides, periodic acid and salts, perbromic acid and salts, perchloric acid and salts, perboric acid and salts, iodic acid and salts, permaganates, potassium ferricyanide, chlorates, percarbonates, persulfates, bromates, chromates, cerium compounds, and mixtures thereof).

All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the spirit and scope of the invention as defined by the following claims.

What is claimed is:

1. A method of polishing or planarizing a substrate comprising abrading at least a portion of the surface of a substrate comprising tungsten with a composition comprising a silica abrasive and a liquid carrier, wherein the composition has a pH of about 7 or less and the silica abrasive has a total surface hydroxyl group density no greater than about 3 hydroxyl groups per $nm^2$.

2. The method of claim 1, wherein the silica abrasive is fumed silica.

3. The method of claim 1, wherein the total surface hydroxyl group density is no greater than about 2.8 hydroxyl groups per $nm^2$.

4. The method of claim 3, wherein the total surface hydroxyl group density is no greater than about 2.5 hydroxyl groups per $nm^2$.

5. The method of claim 1, wherein the substrate further comprises a metal oxide.

6. The method of claim 5, wherein the metal oxide of the substrate is selected from the group consisting of alumina, titania, ceria, zirconia, germania, magnesia, and combinations thereof.

7. The method of claim 5, wherein the metal oxide of the substrate is silica.

8. The method of claim 1, wherein the substrate further comprises a metal composite.

9. The method of claim 8, wherein the metal composite of the substrate is titanium nitride, tungsten nitride, and nickel-phosphorus.

10. The method of claim 1, wherein the composition has a pH of 4–6.

* * * * *